US008879308B2

(12) United States Patent
Chung et al.

(10) Patent No.: US 8,879,308 B2
(45) Date of Patent: *Nov. 4, 2014

(54) RAISING PROGRAMMING CURRENTS OF MAGNETIC TUNNEL JUNCTIONS USING WORD LINE OVERDRIVE AND HIGH-K METAL GATE

(75) Inventors: Shine Chung, San Jose, CA (US);
Tao-Wen Chung, Zhubei (TW);
Chun-Jung Lin, Hsin-Chu (TW);
Yu-Jen Wang, Hsin-Chu (TW);
Hung-Sen Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 128 days.

This patent is subject to a terminal disclaimer.

(21) Appl. No.: 13/550,262

(22) Filed: Jul. 16, 2012

(65) Prior Publication Data

US 2012/0281464 A1    Nov. 8, 2012

Related U.S. Application Data

(63) Continuation of application No. 12/687,747, filed on Jan. 14, 2010, now Pat. No. 8,223,534.

(60) Provisional application No. 61/166,573, filed on Apr. 3, 2009.

(51) Int. Cl.
*G11C 11/00* (2006.01)
*G11C 8/08* (2006.01)
*G11C 11/16* (2006.01)

(52) U.S. Cl.
CPC . *G11C 11/16* (2013.01); *G11C 8/08* (2013.01)
USPC .......................................... 365/158; 365/171

(58) Field of Classification Search
USPC ................... 365/158, 171, 230.06, 189.09
See application file for complete search history.

(56) References Cited

U.S. PATENT DOCUMENTS

| 6,944,844 B2 | 9/2005 | Liu |
| 7,990,753 B2 | 8/2011 | Matsuo |
| 2004/0232408 A1* | 11/2004 | Heeger et al. .................... 257/40 |
| 2008/0171406 A1 | 7/2008 | Orimoto et al. |
| 2009/0073756 A1 | 3/2009 | Yang |
| 2010/0321985 A1* | 12/2010 | Yang ............................ 365/158 |

FOREIGN PATENT DOCUMENTS

| CN | 101401194 A | 4/2009 |
| EP | 1895577 A1 | 3/2008 |

* cited by examiner

*Primary Examiner* — Vu Le
(74) *Attorney, Agent, or Firm* — Slater & Matsil, L.L.P.

(57) ABSTRACT

A method of operating magneto-resistive random access memory (MRAM) cells includes providing an MRAM cell, which includes a magnetic tunneling junction (MTJ) device; and a selector comprising a source-drain path serially coupled to the MTJ device. The method further includes applying an overdrive voltage to a gate of the selector to turn on the selector.

20 Claims, 4 Drawing Sheets

RAISING PROGRAMMING CURRENTS OF MAGNETIC TUNNEL JUNCTIONS USING WORD LINE OVERDRIVE AND HIGH-K METAL GATE

This application is a continuation of U.S. patent application Ser. No. 12/687,747, filed on Jan. 14, 2010, and entitled "Raising Programming Currents of Magnetic Tunnel Junctions Using Word Line Overdrive and High-k Metal Gate," which application further claims the benefit of U.S. Provisional Application No. 61/166,573 filed on Apr. 3, 2009, entitled "Raising Programming Currents of Magnetic Tunnel Junctions Using Word Line Overdrive and High-k Metal Gate," which applications are hereby incorporated herein by reference.

TECHNICAL FIELD

The present invention relates generally to memory devices, and more particularly to the writing (programming) of magneto-resistive random access memory (MRAM) devices.

BACKGROUND

Semiconductors are used in integrated circuits for electronic applications, including radios, televisions, cell phones, and personal computing devices. One type of well-known semiconductor device is the semiconductor storage device, such as dynamic random access memories (DRAMs), or flash memories, both of which use charges to store information.

A more recent development in semiconductor memory devices involves spin electronics, which combines semiconductor technology and magnetic materials and devices. The spin polarization of electrons, rather than the charge of the electrons, is used to indicate the state of "1" or "0." One such spin electronic device is a spin torque transfer (STT) magnetic tunneling junction (MTJ) device 10, as shown in FIG. 1.

MTJ device 10 includes free layer 12, tunnel layer 14, and pinned layer 16. The magnetization direction of free layer 12 can be reversed by applying a current through tunnel layer 14, which causes the injected polarized electrons within free layer 12 to exert so-called spin torques on the magnetization of free layer 12. Pinned layer 16 has a fixed magnetization direction. When current I1 flows in the direction from free layer 12 to pinned layer 16, electrons flow in a reverse direction, that is, from pinned layer 16 to free layer 12. The electrons are polarized to the same magnetization direction of pinned layer 16 after passing pinned layer 16; flowing through tunnel layer 14; and then into and accumulating in free layer 12. Eventually, the magnetization of free layer 12 is parallel to that of pinned layer 16, and MTJ device 10 will be at a low resistance state. The electron injection caused by current I1 is referred to as a major injection.

When current I2 flowing from pinned layer 16 to free layer 12 is applied, electrons flow in the direction from free layer 12 to pinned layer 16. The electrons having the same polarization as the magnetization direction of pinned layer 16 are able to flow through tunnel layer 14 and into pinned layer 16. Conversely, electrons with polarization differing from the magnetization of pinned layer 16 will be reflected (blocked) by pinned layer 16 and will accumulate in free layer 12. Eventually, magnetization of free layer 12 becomes anti-parallel to that of pinned layer 16, and MTJ device 10 will be at a high resistance state. The respective electron injection caused by current I2 is referred to as a minor injection.

To eliminate the parasitic loading of MRAM cells, when MRAM cells are integrated in MRAM arrays, word-line selectors are used to electrically isolate the unselected MRAM cells from source lines. For example, FIG. 2 illustrates an MRAM cell including MTJ device 10 connected to word-line selector 20, which is controlled by word-line 22. When MTJ device 10 is selected for writing or reading, word-line 22 is set to logic high, so that writing current I can pass MTJ device 10. For the unselected rows, word-line 22 is applied with a logic low voltage. The addition of word-line selector 20, however, limits the current that can flow through MTJ device 10. The writing current of MTJ device 10 is limited by the current-providing capacity of word-line selector 20. To effectively and reliably program MTJ device 10, writing current I needs to be very high. However, this requires word-line selector 20 to be large. The increase in the size of word-line selector 20 causes the required chip area usage per cell to be increased. The requirement to increase the size of word-line selector 20 conflicts with the demand of increasing the density of MRAM arrays. A solution is thus needed.

SUMMARY OF THE INVENTION

In accordance with one aspect of the present invention, a method of operating magneto-resistive random access memory (MRAM) cells includes providing an MRAM cell, which includes a magnetic tunneling junction (MTJ) device; and a selector having a source-drain path serially coupled to the MTJ device. The method further includes applying an overdrive voltage to a gate of the selector to turn on the selector.

In accordance with another aspect of the present invention, a method of operating an MRAM array includes providing a semiconductor chip including the MRAM array and a logic circuit. The MRAM array includes a plurality of MRAM cells arranged as rows and columns. Each of the plurality of MRAM cells includes an MTJ device, and a selector including a source-drain path serially coupled to the MTJ device. The MRAM array further includes a plurality of bit-lines parallel to each other and extending in a column direction; and a plurality of source lines parallel to each other and extending in a row direction. Each of the plurality of MRAM cells is coupled between one of the plurality of bit-lines and one of the plurality of source lines. The MRAM array further includes a plurality of word-lines parallel to each other and extending in the row direction, wherein gates of the selectors of the plurality of MRAM cells in a same row are connected to a same one of the plurality of word-lines. The method further includes providing a logic power supply voltage to operate the logic circuit; and providing a pulse to one of the plurality of word-lines connected to a selected one of the plurality of MRAM cells to write the selected one of the plurality of MRAM cells. The pulse has an overdrive voltage higher than the logic power supply voltage.

In accordance with yet another aspect of the present invention, an integrated circuit includes an MRAM cell, which includes an MTJ device and a selector having a source-drain path serially coupled to the MTJ device. The integrated circuit further includes a power source coupled to, and configured to provide pulses to, a gate of the selector, wherein the pulses have an overdrive voltage.

In accordance with yet another aspect of the present invention, an integrated circuit includes an MRAM cell, which further includes an MTJ device and a selector having a source-drain path serially coupled to the MTJ device. The selector comprises a metal-oxide-semiconductor (MOS) transistor including a high-k gate dielectric having a k value greater than about 7.0 and a metal gate electrode over the high-k gate dielectric.

The advantageous features of the present invention include increased driving ability in word-line selectors without requiring an increase in the size of the word-line selectors. Further, no additional manufacturing cost is involved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

Novel methods for writing magneto-resistive random access memory (MRAM) cells are presented. The variations and the operation of the embodiments are then discussed. Throughout the various views and illustrative embodiments of the present invention, like reference numbers are used to designate like elements.

Figure 1:
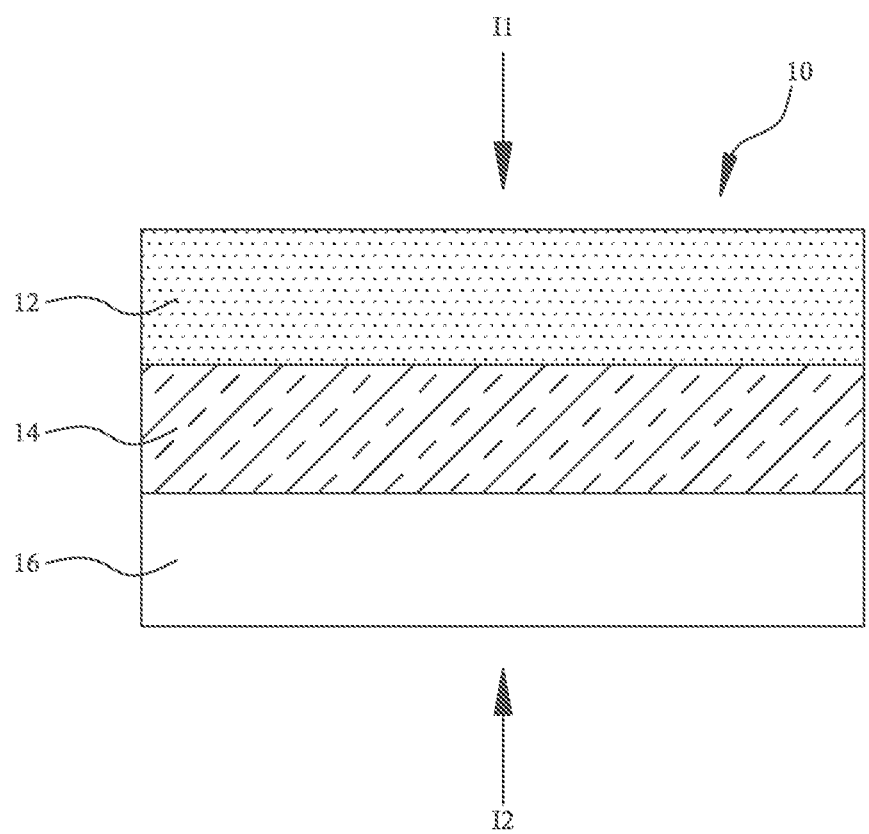
FIG. 1 illustrates a cross-sectional view of a conventional magneto-resistive random access memory (MRAM) cell.
Figure 2:
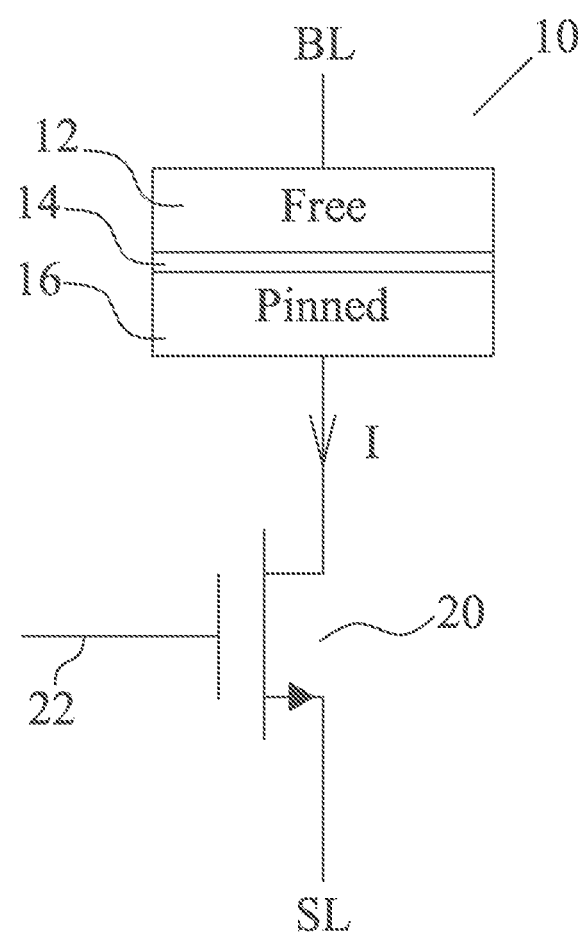
FIG. 2 illustrates a conventional or an MRAM cell controlled by a selector.
Figure 3:
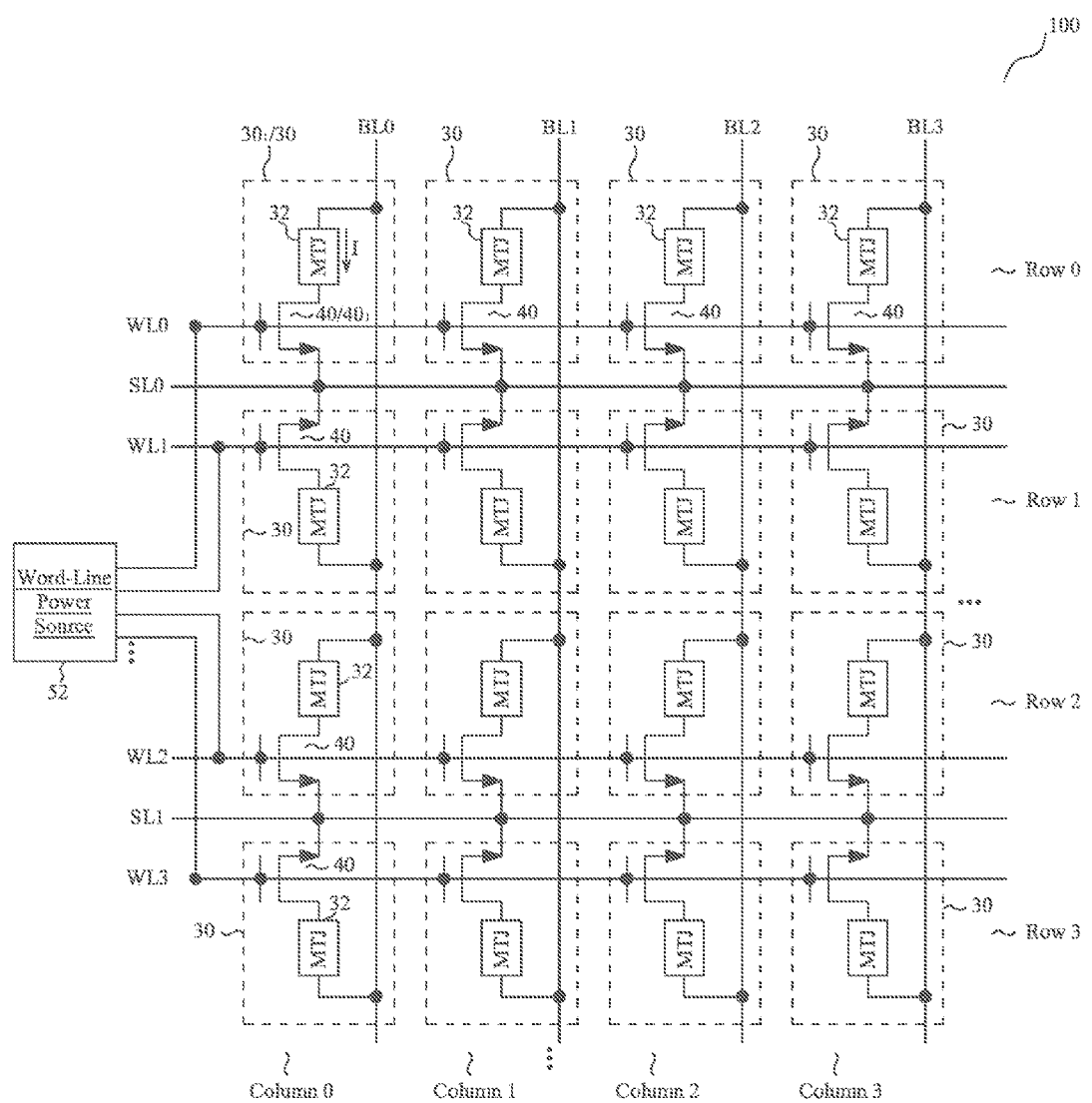
FIG. 3 illustrates an MRAM array with a power source providing an overdrive voltage.

FIG. 3 illustrates an embodiment, which includes MRAM array 100 comprising a plurality of MRAM cells 30 arranged in rows (denoted as Row 0, Row 1, Row 2, and the like) and columns (denoted as Column 0, Column 1, Column 2, and the like). Bit-lines BL (denoted as BL0, BL1, BL2, and the like) extend in the column direction. Word-lines WL (denoted as WL0, WL1, WL2, and the like) and source lines SL (denoted as SL0, SL1, and the like) extend in the row direction. It is appreciated that the row direction and the column direction are interchangeable, depending on from which direction MRAM array 100 is viewed.

Each of MRAM cells 30 is coupled between one of bit-lines BL and one of source lines SL. Each of MRAM cells 30 includes magnetic tunnel junction (MTJ) 32 and word-line selector (also known as word-line driver) 40, which may be an n-type metal-oxide-semiconductor (MOS) transistor. Word-line selectors 40 have their source-drain paths serially connected to respective MTJ devices 32, and hence they may isolate MTJ device 32 from the respective source lines SL when turned off. When writing or reading operations are performed to one of the MRAM cells 30, the respective word-line selector 40 is turned on so that the writing current or reading current can flow through MRAM cell 30. Although FIG. 3 illustrates that word-line selector 40 is closer to the respective source line SL than to the respective bit-line BL, word-line selector 40 may also be placed closer to the respective bit-line BL.

Throughout the description, when a write or a read operation is to be performed to a selected MRAM cell, the respective row and the respective column in which the selected MRAM cell is located are referred to as a selected row and a selected column, respectively. In the following discussion, it is assumed that MRAM cell $30_1$ is selected, and hence row 0 and column 0 are the selected row and the selected column, respectively. When a write operation is to be performed to the selected MRAM cell $30_1$, word-line WL0 is applied with a logic high voltage, while the unselected word-lines are applied with a logic low voltage. Accordingly, word-line selector $40_1$ of MRAM cell $30_1$ (and selectors 40 of MRAM cells 30 in row 0) is turned on, while word-line selectors 40 in other unselected rows are turned off. The writing current I for programming MTJ $30_1$ may be generated by applying appropriate voltages to bit-line BL0 and source line SL0, with one of bit-line BL0 and source line SL0 being at a high voltage, and the other being at a low voltage.

Figure 4:
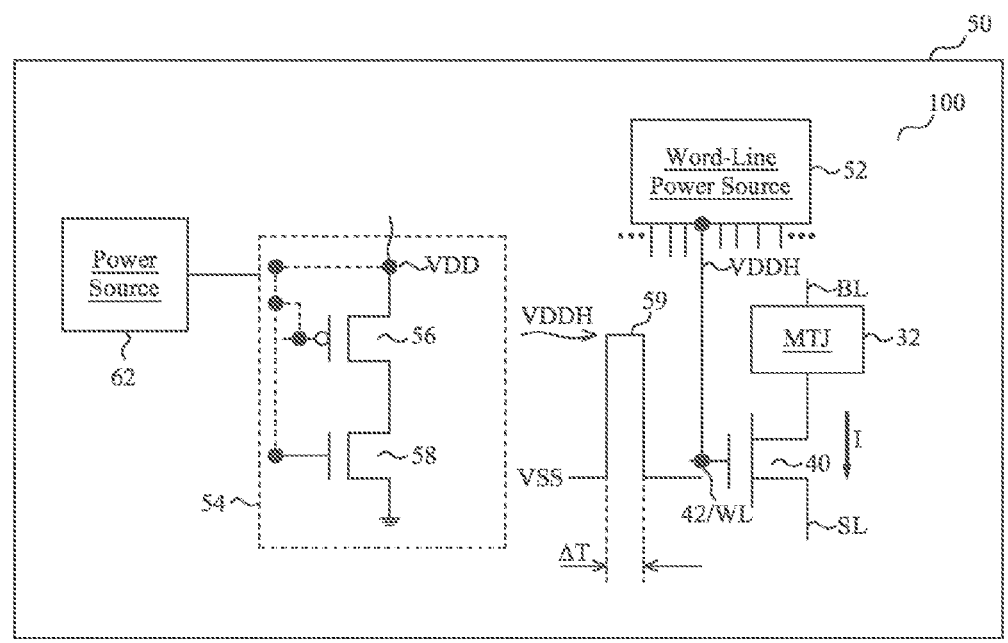
FIG. 4 schematically illustrates an MRAM cell and a logic circuit.

FIG. 4 schematically illustrates semiconductor chip 50, in which MRAM array 100 as shown in FIG. 3 is formed. For a clear view, only one of MRAM cells 30 in MRAM array 100 is shown. The teaching regarding the illustrated MRAM cell 30, however, applies to all other MRAM cells 30 in MRAM array 100. Word-line power source 52 is coupled to gate 42 of word-line selector 40. In an embodiment, word-line power source 52 may include a plurality of outputs, each coupled to one of word-lines WL (also refer to FIG. 3), so that different word-lines WL can have different voltages, depending on whether the respective row is selected or not.

Chip 50 also includes logic circuit 54 comprising logic MOS devices, for example, logic PMOS device 56 and logic NMOS device 58. As is known in the art, a logic circuit may be a combinational address decoder or any other circuit controlling the operation of MRAM array 100. An exemplary logic circuit may include NAND gates, NOR gates, inverters, multiplexers, and the like. The power supply of logic circuit 54 includes power source 62, which provides positive power supply voltage VDD (referred to as logic power supply voltage VDD hereinafter) to operate logic circuit 54. In an exemplary embodiment, logic power supply voltage VDD is 1.2V. However, it is appreciated that logic power supply voltage VDD of logic circuit 54 is related to the specific circuit design and the technology generation, and may have higher or lower values. Logic power supply voltage VDD may be applied to logic circuit 54 and/or the gates of MOS devices 56 and 58 in a continuous form, as compared to short pulses. In an embodiment, MOS device 58 has a same (or substantially the same) structure as, and may be formed simultaneously with the formation of, word-line selector 40. For example, the gate electrodes, gate dielectrics, source and drain regions (not shown in FIG. 4, please refer to FIG. 5) of MOS device 58 and word-line selector 40 may (or may not) have the same materials and thicknesses. Further, MOS device 58 and word-line selector 40 may or may not have a same gate width-to-length ratio.

To increase the writing current I for writing to MTJ devices 32, word-line selector 40 is overdriven by a gate voltage higher than the logic power supply voltage VDD. This is achieved by word-line power source 52, which provides an overdrive power supply voltage VDDH to word lines WL of the selected rows. Overdrive power supply voltage VDDH is higher than logic power supply voltage VDD. In an embodiment, overdrive power supply voltage VDDH may be higher than logic power supply voltage VDD by greater than about 2.5 volts. In alternative embodiments, overdrive power supply voltage VDDH may be higher than logic power supply voltage VDD by greater than about 110 percent. Overdrive power supply voltage VDDH may be (or may not be) so high that, if it is provided to the gate of logic MOS device 58, since the gate voltage of MOS device 58 may be applied in continuous form, MOS device 58 may be damaged. It is realized, however, that the optimum difference between overdrive power supply voltage VDDH and logic power supply voltage VDD is determined by various factors, such as the size of word-line selector 40, the required writing current I of MTJ devices 32, the maximum voltage that can be sustained by word-line selector 40 without causing damage, and the like, and may be found through experiments.

It is noted that unlike logic circuit devices 56 and 58 that may operate under constant power supply voltage VDD, overdrive power supply voltage VDDH is applied to gate 42 of word-line selector 40 in the form of short pulses, wherein the pulses are provided only when write operations or read operations are performed. After the write operation or the read operation is finished, word-line power source 52 provides a low voltage (for example, VSS, or zero volt) to gate 42. An exemplary pulse 59 is shown in FIG. 4. In an exemplary embodiment, pulse 59 has duration $\Delta T$ less than about 1 microsecond, although longer or shorter pulses may be used.

When the write operation is performed, a high voltage and a low voltage are applied to bit-line BL and source line SL, while the polarity of the voltages depends on the value to be written into MTJ device 32, and may be reversed. An exemplary low voltage is VSS, which may be the electrical ground. In an embodiment, the high voltage is equal to logic power supply voltage VDD. In other embodiments, the high voltage is equal to overdrive power supply voltage VDDH. In yet other embodiments, the high voltage is different from both logic power supply voltage VDD and overdrive power supply voltage VDDH, for example, higher or lower than overdrive power supply voltage VDDH.

Figure 5:
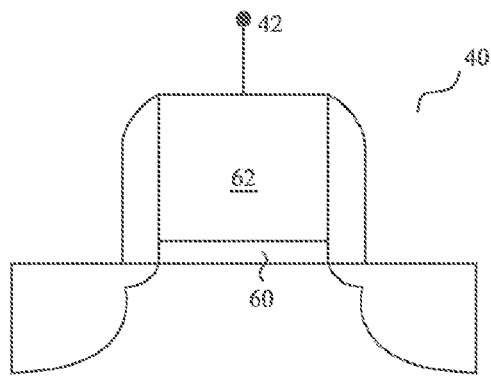
FIG. 5 illustrates a cross-sectional view of an exemplary word-line selector.

To further increase the drive current of word-line selector 40, word-line selector 40 may include a high-k gate dielectric material and a metal gate. FIG. 5 illustrates a cross-sectional view of word-line selector 40. Gate dielectric 60 is formed of a high-k dielectric material, for example, with a dielectric constant (k value) greater than about 7.0. The k value may also be greater than about 12, or even greater than about 20. Exemplary high-k materials include aluminum-containing dielectrics such as $Al_2O_3$, HfAlO, HfAlON, AlZrO, Hf-containing materials such as $HfO_2$, $HfSiO_x$, $HfAlO_x$, $HfZrSiO_x$, HfSiON, and/or other materials such as $LaAlO_3$ and $ZrO_2$. Gate dielectric layer 60 may also include oxides, nitrides, oxynitrides, multi-layers thereof, and combinations thereof.

Gate electrode 62 may be a metal gate formed of metals, metal nitrides, metal silicides, or the like. In an embodiment, gate electrode 62 may have a work function suitable for forming NMOS devices, which work function may be between about 4.0 eV and about 4.4 eV, and may be a conduction band-edge work function (close to the conduction band of silicon, which is about 4.1 eV). The exemplary materials include tantalum-containing materials such as TaC, TaN, TaSiN, and combinations thereof. By incorporating high-k gate dielectric 60 and metal gate electrode 62, the drive current of word-line selector 40 may be further increased.

The embodiments of the present invention have several advantageous features. By overdriving word-line selector 40, which may comprise a high-k gate dielectric and a metal gate electrode, the drive current of word-line selector 40 may be increased without requiring an increase in chip area usage. Accordingly, high-density MRAM arrays may be formed with improved reliability and improved writing speed.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit comprising:
    a magneto-resistive random access memory (MRAM) cell comprising:
        a magnetic tunneling junction (MTJ) device; and
        a selector comprising a source-drain path serially coupled to the MTJ device; and
    a power source coupled to, and configured to provide pulses to, a gate of the selector, wherein the pulses have an overdrive voltage, and wherein the overdrive voltage is capable of damaging the selector when the overdrive voltage is applied to the gate of the selector in a continuous form.

2. The integrated circuit of claim 1 further comprising:
    a logic circuit in a same chip as the MRAM cell; and
    a logic power source coupled to the logic circuit, wherein the logic power source is configured to provide a positive power supply voltage lower than the overdrive voltage to the logic circuit.

3. The integrated circuit of claim 2, wherein the overdrive voltage is higher than the positive power supply voltage by greater than about 2.5 volts.

4. The integrated circuit of claim 2, wherein the overdrive voltage is higher than the positive power supply voltage by greater than about 110 percent.

5. The integrated circuit of claim 2, wherein the logic circuit comprises a logic MOS device, and wherein the selector has substantially a same gate structure as the logic MOS device.

6. The integrated circuit of claim 2, wherein the logic circuit is selected from the group consisting essentially of an NAND gate, a NOR gate, an inverter, a multiplexer, and combinations thereof.

7. The integrated circuit of claim 1, wherein the selector comprises a MOS device comprising a gate dielectric having a k value greater than about 7.0, and a metal gate electrode over the gate dielectric.

8. The integrated circuit of claim 1, wherein the MRAM cell is in a MRAM array comprising:
    a plurality of word-lines;
    a plurality of bit-lines; and
    a plurality of source lines, wherein a gate of the selector is coupled to one of the plurality of word-lines.

9. The integrated circuit of claim 8, wherein the power source comprises a plurality of outputs, each being configured to provide the overdrive voltage to one of the plurality of word-lines.

10. An integrated circuit comprising:
    a magneto-resistive random access memory (MRAM) cell comprising:

a magnetic tunneling junction (MTJ) device; and
a selector comprising a source-drain path serially coupled to the MTJ device, wherein the selector comprises a metal-oxide-semiconductor (MOS) transistor comprising a high-k gate dielectric having a k value greater than about 7.0, and a metal gate electrode over the high-k gate dielectric; and
a power source coupled to, and configured to provide pulses to, the metal gate electrode of the selector, wherein the pulses have an overdrive voltage that is capable of damaging the selector when applied continuously.

11. The integrated circuit of claim 10, wherein the k value is greater than about 20.

12. The integrated circuit of claim 10 further comprising:
a logic circuit in a same chip as the MRAM cell; and
a logic power source coupled to the logic circuit, wherein the logic power source is configured to provide a positive power supply voltage to the logic circuit, wherein the positive power supply voltage is lower than the overdrive voltage.

13. The integrated circuit of claim 10, wherein the MRAM cell is in a MRAM array comprising:
a plurality of word-lines;
a plurality of bit-lines; and
a plurality of source lines, wherein the metal gate electrode of the selector is coupled to one of the plurality of word-lines.

14. The integrated circuit of claim 13, wherein the power source comprises a plurality of outputs, each being configured to provide the overdrive voltage to one of the plurality of word-lines.

15. The integrated circuit of claim 1, wherein the pulses have durations shorter than about 1 microsecond.

16. The integrated circuit of claim 10, wherein the pulses have durations shorter than about 1 microsecond.

17. An integrated circuit comprising:
a bit-line;
a word-line;
a magneto-resistive random access memory (MRAM) cell comprising:
a magnetic tunneling junction (MTJ) device with a first end connected to the bit-line; and
a selector comprising:
a source/drain region connected to a second end of the MTJ device; and
a gate connected to the word-line; and
a power source coupled to, and configured to provide pulses to, the gate of the selector, wherein the pulses have an overdrive voltage, and wherein the overdrive voltage is capable of damaging the selector when the overdrive voltage is applied to the gate of the selector in a continuous form.

18. The integrated circuit of claim 17, wherein the pulses have durations shorter than about 1 microsecond.

19. The integrated circuit of claim 17 further comprising:
a logic circuit in a same chip as the MRAM cell; and
a logic power source coupled to the logic circuit, wherein the logic power source is configured to provide a positive power supply voltage lower than the overdrive voltage to the logic circuit.

20. The integrated circuit of claim 19, wherein the overdrive voltage is higher than the positive power supply voltage by greater than about 2.5 volts.

* * * * *